(12) United States Patent
Adut et al.

(10) Patent No.: US 12,506,454 B2
(45) Date of Patent: Dec. 23, 2025

(54) VOLTAGE-TO-CURRENT CONVERTER WITH COMPLEMENTARY CURRENT MIRRORS

(71) Applicant: Analog Devices International Unlimited Company, Limerick (IE)

(72) Inventors: Joseph Adut, San Diego, CA (US); Jeremy Wong, Sunnyvale, CA (US); Brian Hamilton, Menlo Park, CA (US); Gregory Fung, Fremont, CA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 18/450,213

(22) Filed: Aug. 15, 2023

(65) Prior Publication Data

US 2023/0387872 A1 Nov. 30, 2023

Related U.S. Application Data

(60) Continuation of application No. 17/679,030, filed on Feb. 23, 2022, now Pat. No. 11,764,743, which is a
(Continued)

(51) Int. Cl.
*G05F 3/26* (2006.01)
*H03F 3/45* (2006.01)
*G01S 7/4861* (2020.01)

(52) U.S. Cl.
CPC ......... *H03F 3/45273* (2013.01); *G05F 3/262* (2013.01); *G05F 3/265* (2013.01); *H03F 3/45174* (2013.01); *G01S 7/4861* (2013.01)

(58) Field of Classification Search
CPC ............. H03F 3/45273; H03F 3/45174; H03F 2200/363; H03F 3/345; H03F 3/3432;
(Continued)

(56) References Cited

U.S. PATENT DOCUMENTS 4,354,122 A 10/1982 Embree et al.
4,893,091 A 1/1990 Lillis et al.
(Continued)

FOREIGN PATENT DOCUMENTS

CN 1138246 A 12/1996
CN 101064497 A 10/2007
(Continued)

OTHER PUBLICATIONS

Extended European Search Report in EP20190776.3, mailed May 31, 2021, 11 pages.
(Continued)

*Primary Examiner* — Jung Kim
(74) *Attorney, Agent, or Firm* — ArentFox Schiff LLP

(57) ABSTRACT

Voltage-to-current converters that include two current mirrors are disclosed. In an example voltage-to-current converter each current mirror is a complementary current mirror in that one of its input and output transistors is a P-type transistor and the other one is an N-type transistor. Such voltage-to-current converters may be implemented using bipolar technology, CMOS technology, or a combination of bipolar and CMOS technologies, and may be made sufficiently compact and accurate while operating at sufficiently low voltages and consuming limited power.

15 Claims, 11 Drawing Sheets

Related U.S. Application Data division of application No. 16/849,080, filed on Apr. 15, 2020, now Pat. No. 11,323,085.

(60) Provisional application No. 62/895,576, filed on Sep. 4, 2019.

(58) Field of Classification Search
CPC ..... H03F 2200/411; H03F 2203/45528; H03F 3/087; H03F 3/45475; G05F 3/265; G05F 3/262; G05F 3/26; G05F 1/561; G01S 7/4861

See application file for complete search history.

(56) References Cited

U.S. PATENT DOCUMENTS

| | | | |
|---|---|---|---|
| 5,612,614 | A | 3/1997 | Barrett, Jr. et al. |
| 5,710,527 | A | 1/1998 | Yaguchi et al. |
| 5,754,039 | A | 5/1998 | Nishimura |
| 6,529,078 | B1 | 3/2003 | Gosser et al. |
| 6,586,919 | B2 | 7/2003 | Viehmann |
| 8,836,313 | B2 | 9/2014 | Takagi et al. |
| 2002/0084853 | A1 | 7/2002 | Finlay et al. |
| 2002/0089371 | A1* | 7/2002 | Goutti ................. G05F 3/265 327/538 |
| 2003/0020446 | A1 | 1/2003 | Viehmann |
| 2005/0030091 | A1 | 2/2005 | Derksen |
| 2008/0150638 | A1* | 6/2008 | Seth ................. H03F 1/301 330/296 |
| 2010/0052645 | A1 | 3/2010 | Huang et al. |
| 2015/0097540 | A1 | 4/2015 | Wang |
| 2016/0336931 | A1 | 11/2016 | Hummerston et al. |
| 2017/0346454 | A1 | 11/2017 | Menacher |
| 2018/0275250 | A1 | 9/2018 | Adut |
| 2018/0284272 | A1 | 10/2018 | Adut |
| 2018/0284919 | A1 | 10/2018 | Kaddouri et al. |
| 2019/0058322 | A1 | 2/2019 | Basso et al. |
| 2019/0219674 | A1 | 7/2019 | Tokmak et al. |

FOREIGN PATENT DOCUMENTS

| | | |
|---|---|---|
| CN | 201839193 U | 5/2011 |
| CN | 104516382 A | 4/2015 |
| CN | 106155174 A | 11/2016 |
| CN | 107491132 A | 12/2017 |
| CN | 207069908 U | 3/2018 |
| CN | 108664077 A | 10/2018 |
| CN | 110034825 A | 7/2019 |
| DE | 10328605 A1 | 1/2005 |
| EP | 0337444 B1 | 10/1992 |
| EP | 0565299 A1 | 10/1993 |
| EP | 0373471 B1 | 4/1994 |

OTHER PUBLICATIONS

MacLachlan et al., "Power voltage current converter using quasi complementary MOSFET current mirrors," Electronics Letters, Oct. 13, 2011, vol. 47, No. 21, 2 pages.

McGraw-Hill, "Chapter 5: Current Mirrors and Biasing Techniques," McGraw-Hill Education, 2017, 49 pages.

Notification to Grant Patent Right in CN202010923475.3, mailed Mar. 30, 2022, 4 pages.

\* cited by examiner

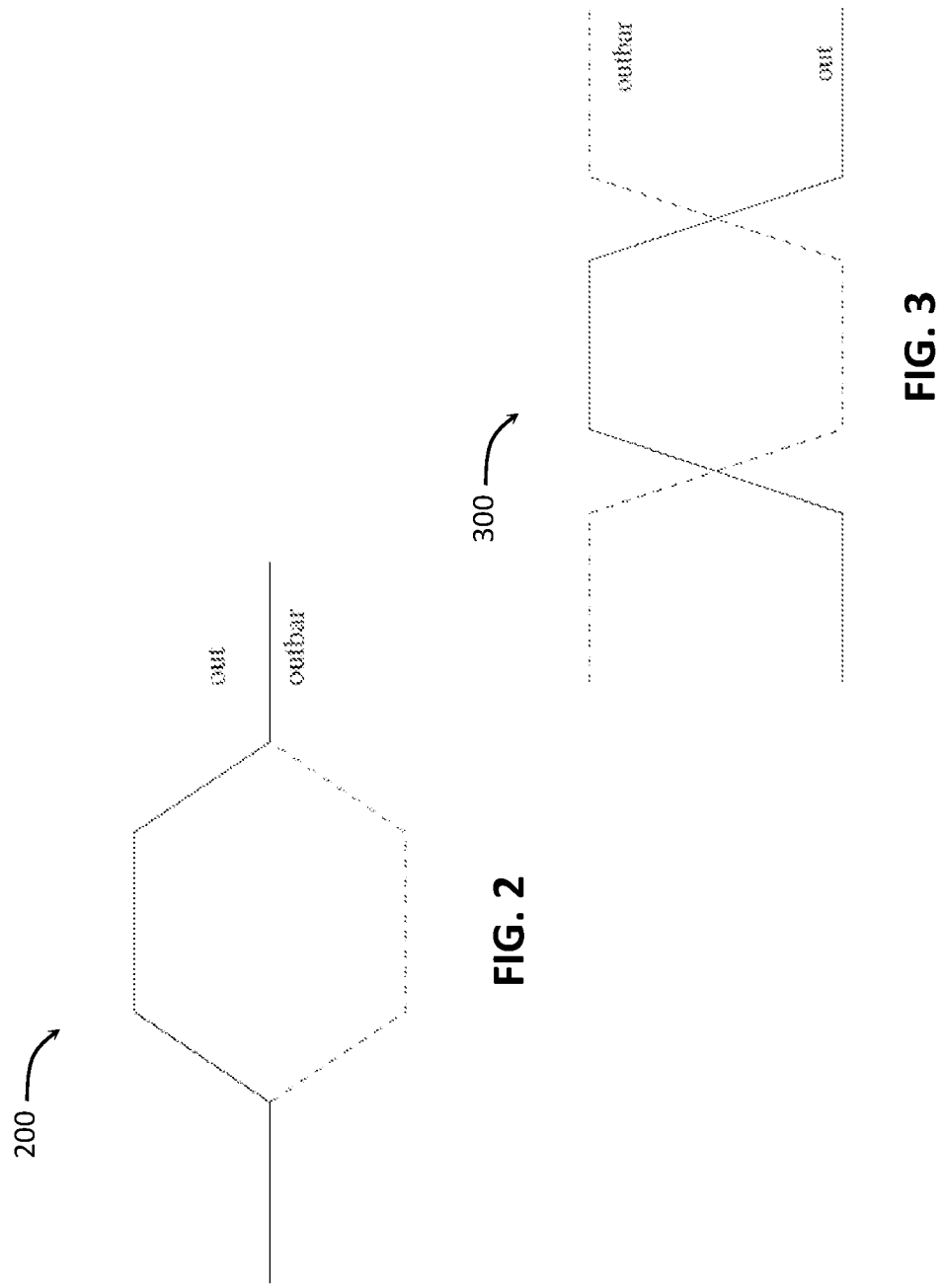

US 12,506,454 B2

VOLTAGE-TO-CURRENT CONVERTER WITH COMPLEMENTARY CURRENT MIRRORS

CROSS REFERENCE TO RELATED APPLICATIONS

This application is a continuation of U.S. patent application Ser. No. 17/679,030 filed on Feb. 23, 2022 (now U.S. Pat. No. 11,764,743, issued Sep. 19, 2023), which application is a divisional of U.S. patent application Ser. No. 16/849,080, filed on Apr. 15, 2020 (now U.S. Pat. No. 11,323,085, issued May 3, 2022), which application claims the benefit of and priority to U.S. Provisional Patent Application No. 62/895,576, filed Sep. 4, 2019, the contents of each of which applications are hereby incorporated by reference herein in their entireties.

TECHNICAL FIELD OF THE DISCLOSURE

The present disclosure relates generally to electronics and, more specifically, to voltage-to-current converters.

BACKGROUND

A voltage-to-current converter is a device that generates a current corresponding, or proportional to, a definite voltage. Such converters may be used in many applications, especially in instrumentation circuitry, where analog signals are used as representations of physical measurements such as light, temperature, pressure, flow, weight, motion, etc. For example, voltage-to-current converters may be used in light detection and ranging (LIDAR) systems. In particular, one or more voltage-to-current converters may be used in, or associated with, a transimpedance amplifier (TIA) of a LIDAR receiver.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 2 is a graph illustrating a differential output of a TIA in response to unipolar input.

FIG. 3 is a graph illustrating a differential output of a TIA in response to unipolar input with outputs offset.

DESCRIPTION OF EXAMPLE EMBODIMENTS OF THE DISCLOSURE

Overview

Figure 1:
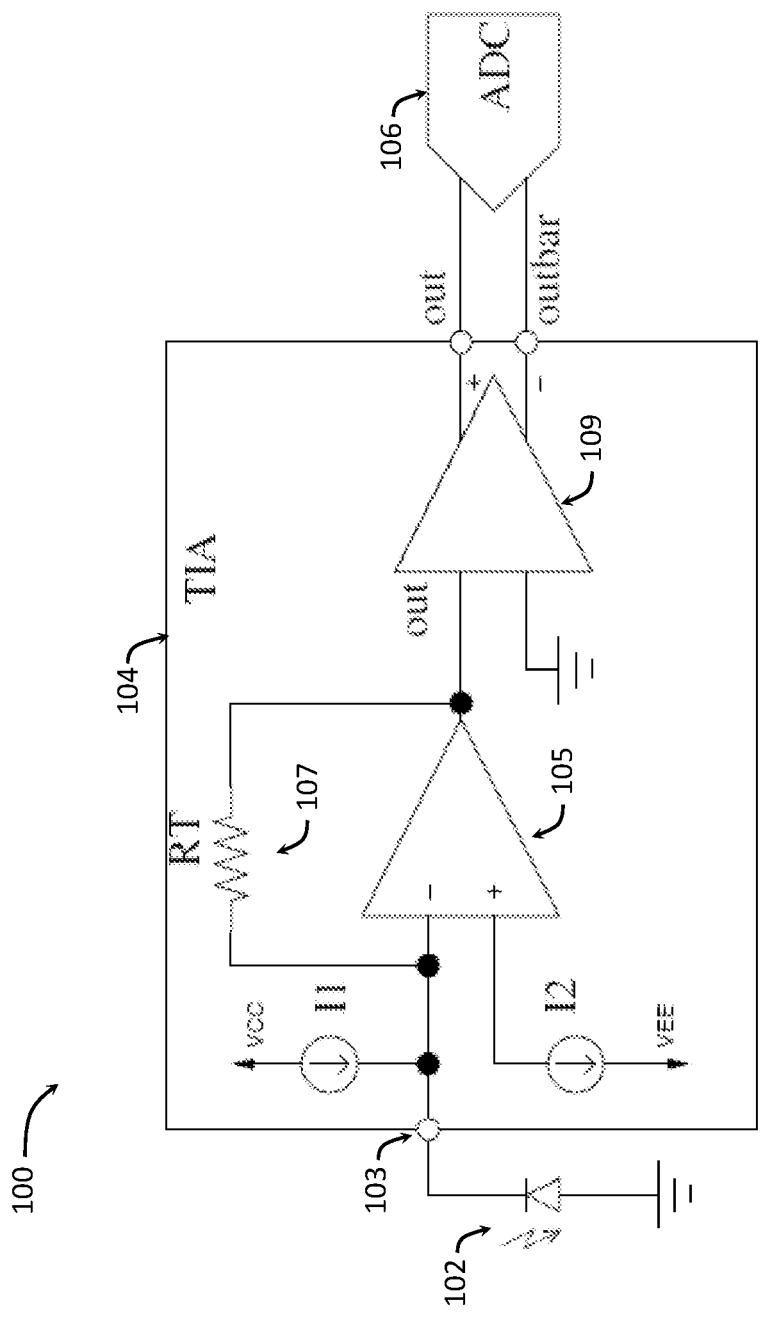
FIG. 1 is a schematic diagram of a LIDAR receiver signal chain, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

Embodiments of the present disclosure provide voltage-to-current converters with complementary current mirrors. The exact design of voltage-to-current converters with complementary current mirrors, described herein, may be realized in many different ways, all of which being within the scope of the present disclosure. In one example of design variations according to various embodiments of the present disclosure, a choice can be made, individually for each of the transistors of a voltage-to-current converter with complementary current mirrors, to employ bipolar transistors (e.g., where various transistors may be NPN or PNP transistors), field-effect transistors (FETs), e.g., metal-oxide-semiconductor (MOS) technology transistors (e.g., where various transistors may be N-type MOS (NMOS) or P-type MOS (PMOS) transistors), or a combination of one or more FETs and one or more bipolar transistors. In view of that, in the following descriptions, transistors are sometimes described with reference to their first, second, and third terminals. The term "first terminal" of a transistor is used to refer to an emitter terminal if the transistor is a bipolar transistor or to a source terminal if the transistor is a FET, the term "second terminal" of a transistor is used to refer to a collector terminal if the transistor is a bipolar transistor or to a drain terminal if the transistor is a FET, and the term "third terminal" of a transistor is used to refer to a base terminal if the transistor is a bipolar transistor or to a gate terminal if the transistor is a FET. These terms remain the same irrespective of whether a transistor of a given technology is an N-type transistor (e.g., an NPN transistor if the transistor is a bipolar transistor or an NMOS transistor if the transistor is a FET) or a P-type transistor (e.g., a PNP transistor if the transistor is a bipolar transistor or a PMOS transistor if the transistor is a FET). In another example, in various embodiments, a choice can be made, individually for each of the transistors of a voltage-to-current converter with complementary current mirrors, as to which transistors are implemented as N-type transistors (e.g., NMOS transistors for the transistors implemented as FETs, or NPN transistors for the transistors implemented as bipolar transistors) and which transistors are implemented as P-type transistors (e.g., PMOS transistors for the transistors implemented as FETs, or PNP transistors for the transistors implemented as bipolar transistors). In yet other examples, in various embodiments, a choice can be made as to what type of transistor architecture to employ. For example, any of the transistors of the voltage-to-current converters with complementary current mirrors as described herein that are implemented as FETs may be planar transistors or may be non-planar transistors (some examples of the latter including FinFETs, nanowire transistors or nanoribbon transistors).

One aspect of the present disclosure provides a voltage-to-current converter that includes two current mirrors, where each current mirror is a complementary current mirror in that it utilizes a pair of transistors with one transistor being an N-type transistor and the other transistor being a P-type transistor. In various embodiments, such a voltage-to-current converter may be implemented using bipolar technology, FET technology, or a combination of bipolar and FET technologies. Voltage-to-current converters according to various embodiments disclosed herein may be made sufficiently compact and accurate, and may operate at sufficiently low voltages while consuming limited power.

Other aspects of the present disclosure provide systems, e.g., LIDAR systems (in particular, LIDAR receivers), that may include one or more voltage-to-current converters as described herein, as well as methods for operating such systems and methods for determining distance to at least one object using such systems. While some embodiments of the present disclosure refer to LIDAR as example systems in which voltage-to-current converters as described herein may be implemented, in other embodiments, voltage-to-current converters as described herein may be implemented in systems other than LIDAR, all of which embodiments being within the scope of the present disclosure.

As will be appreciated by one skilled in the art, aspects of the present disclosure, in particular aspects of voltage-to-current converters as proposed herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g., to the existing receivers, LIDAR systems, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Sometimes, in the present descriptions, the term "circuit" may be omitted (e.g., a current mirror circuit may be referred to simply as a "current mirror," etc.). If used, the terms "substantially," "approximately," "about," etc., may be used to generally refer to being within +/−20% of a target value, e.g., within +/−10% of a target value, based on the context of a particular value as described herein or as known in the art.

Example Use of Voltage-to-Current Converters

For purposes of illustrating voltage-to-current converters with complementary current mirrors, proposed herein, it might be useful to first understand setting in which voltage-to-current converters may be used, as well as phenomena that may come into play when voltage-to-current conversion is performed. The following foundational information may be viewed as a basis from which the present disclosure may be properly explained. Such information is offered for purposes of explanation only and, accordingly, should not be construed in any way to limit the broad scope of the present disclosure and its potential applications.

As described above, voltage-to-current converters may be used in LIDAR systems. LIDAR refers to a surveying method that measures distance to a target object by illuminating the object with light (e.g., with pulses of light) and measuring the reflected light with a sensor. Differences in laser return times and wavelengths can then be used to determine the distance to the object and/or make digital three-dimensional representations of the object. LIDAR systems are used in a variety of situations. For example, LIDAR systems can be used with airplanes, automobiles, binoculars or monoculars, etc.

FIG. 1 is a schematic diagram of a LIDAR receiver 100, according to some embodiments of the present disclosure. A LIDAR receiver typically includes an optical sensor (for example, an avalanche photo-diode (APD)) 102, a TIA 104, and an analog-to-digital converter (ADC) 104. The optical sensor 102 may be configured to receive a pulse of light reflected from an object and to convert the pulse of light to a current pulse. As illustrated in FIG. 1, in some embodiments, the optical sensor 102 may have its cathode connected to the input port of the TIA 104 (the input port of the TIA 104 is illustrated in FIG. 1 with a white dot labeled with "103"). Accordingly, the optical sensor 102 is negatively biased and can sink current from the TIA 104. Although not specifically shown in the present figures, in other embodiments, the optical sensor 102 may have its anode connected to the input port of the TIA 104; accordingly, the optical sensor 102 would then be positively biased and can source current to the TIA 104.

The TIA 104 may be configured to amplify the current pulse from the optical sensor 102 and provide a voltage pulse. In some embodiments, the TIA 104 may be a shunt-shunt feedback TIA, as shown in FIG. 1. Such a TIA may include an amplification circuit 105 and a feedback resistor (RT) 107 electrically coupled between an input of the amplification circuit 105 and an output of the amplification circuit 105. The output of the amplification circuit 105 may be electrically connected to an input of an ADC driver 109. The amplification circuit 105 may include one or more amplifiers. The ADC driver 109 may be configured to drive the ADC 106. For example, the ADC driver 109 may perform a single-to-differential conversion before providing the drive signal to the ADC 106. The ADC 106 may convert the received pulse to a digital signal. The digital signal can be provided to a digital signal processor (not shown in FIG. 1).

In some situations, the optical sensor 102 may generate a direct current (DC) current in response to the background light. Unless this DC current is canceled with an input offset current, e.g., using a current source I1 as shown in FIG. 1, the linear range of TIA may be compromised. The required input offset current I1 may be subject to variation and, therefore, may need to be controlled during operation of the TIA 104. The input offset current may be controlled with an external voltage. In particular, a voltage-to-current converter may be used to convert the external control voltage to current which is then used as the input offset current to reduce or eliminate DC current generated in response to the background light.

Besides using voltage-to-current converters to generate input offset currents for cancelling DC currents as described above, voltage-to-current converters may also be used in generating output offset currents, explained with reference to FIGS. 2 and 3. Typically, the optical sensor 102 generates current only in one direction (i.e., the optical sensor 102 either sinks current to the TIA 104, or sources current from the TIA 104), in which case the TIA 104 receives a unipolar input indicative of the current generated by the optical sensor 102. The TIA 104 then generates a differential output, where FIG. 2 is a graph illustrating a differential output 200 of a TIA in response to unipolar input. As the response of the nominally balanced outputs of the differential TIA, shown in FIG. 2, illustrates, the differential output from a unipolar input effectively wastes half of the input signal range of the ADC 106 to which the output 200 is to be provided. The input signal range of the ADC 106 can be better utilized by modifying, commonly referred to as "tilting," the TIA 104 with an output offset current, e.g., using a current source I2 shown FIG. 1. By using the output offset current, the response of the tilted outputs of the differential TIA becomes a differential output 300 as shown in FIG. 3. Similar to the input offset current I1, the required output offset current I2 may be subject to variation and, therefore, may need to be controlled during operation of the TIA 104, which may be done using an external voltage. To that end, another voltage-to-current converter may be used to generate the output offset current based on the external voltage. It should be noted that, in other embodiments, a voltage-to-current converter (e.g., any of the voltage-to-current converters described herein) may be used to generate an output offset current that is to be applied at the input or output of the amplifier 109 instead of, or in addition to, applying an output offset current to the amplification circuit 105.

As the foregoing illustrates, each LIDAR receiver, in particular the TIA 104 of each LIDAR receiver, may use two voltage-to-current converters—one for DC current cancellation to reduce the effects of the background light sensed by the optical sensor 102, and another one for tilting the output of the TIA 104 to better utilize the input signal range of the ADC 106. Since modern LIDAR systems have numerous such receivers (also sometimes interchangeably referred to as "channels"), each requiring two voltage-to-current converters, there is a need for an accurate, yet compact, converter that can operate at low-voltage while consuming minimal power.

Standard Voltage-to-Current Converters

Figure 4:
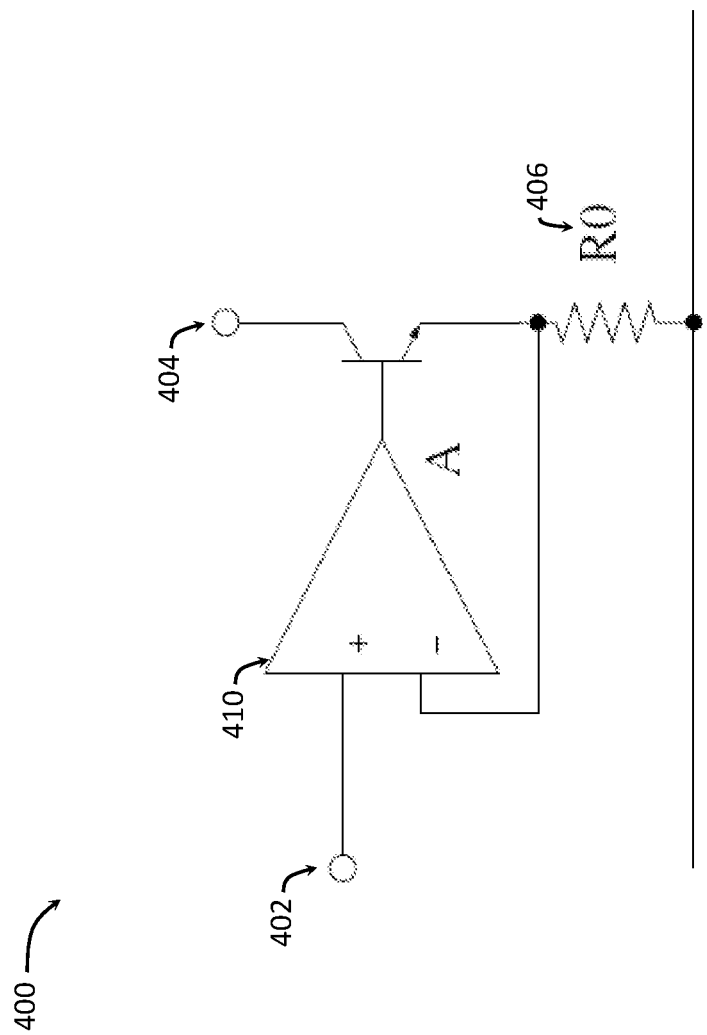
FIG. 4 is an electric circuit diagram of a voltage-to-current converter realized with an operational amplifier.

Standard solutions to convert an input voltage to current make a copy of the input voltage with an operational amplifier onto a resistor, then the current through this resistor is passed to the output with a transistor regulated by the same operational amplifier, as shown in FIG. 4. FIG. 4 is an electric circuit diagram of a voltage-to-current converter 400 with an operational amplifier 410. An input voltage provided at an input terminal 402 is converted to an output current at an output terminal 404 by using the operational amplifier 410 to make the copy of the input voltage onto a resistor 406 (R0).

Figure 5:
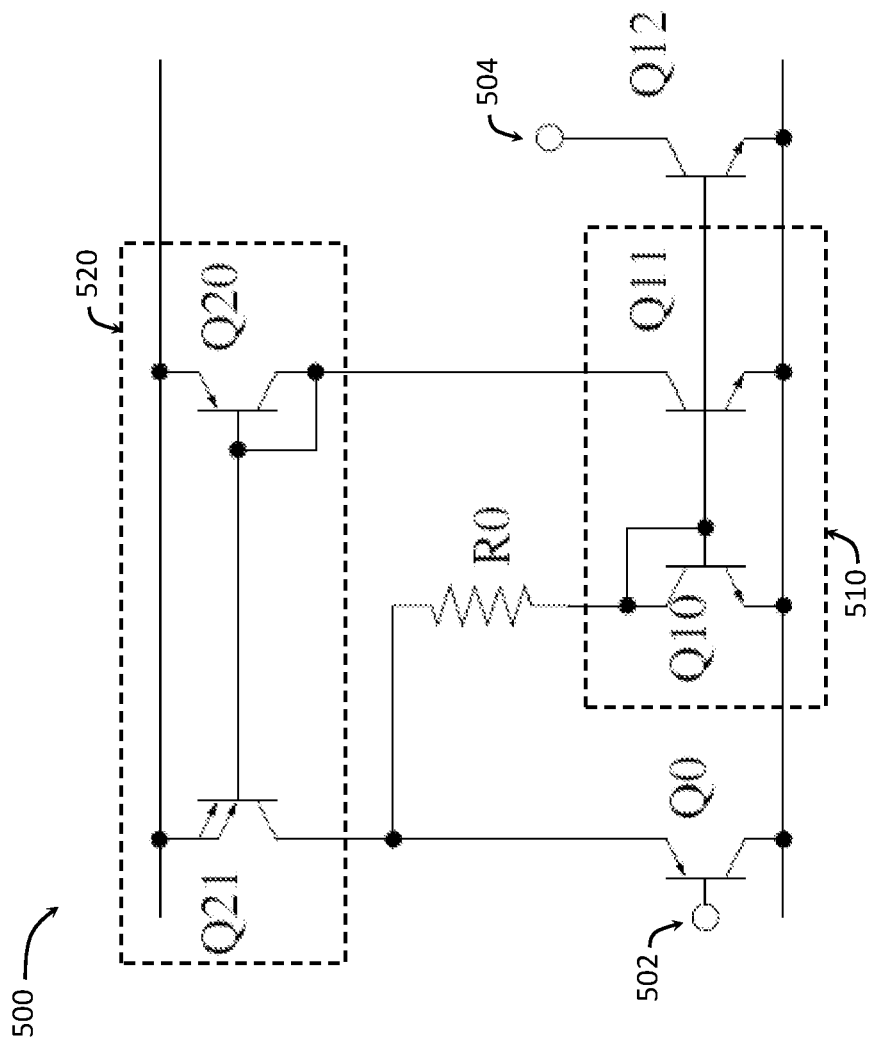
FIG. 5 is an electric circuit diagram of a voltage-to-current converter with an NPN current mirror and a PNP current mirror.

A simpler arrangement may include a current mirror that provides an output current as well a feedback current biasing an input emitter follower. In an example of such a circuit shown in FIG. 5, providing an electric circuit diagram of a voltage-to-current converter 500 with an NPN current mirror 510 and a PNP current mirror 520. The current mirror 510 is referred to as an "NPN current mirror" because both transistors of the current mirror 510, designated in FIG. 5 as transistors Q10 and Q11, are NPN transistors. Similarly, the current mirror 520 is referred to as a "PNP current mirror" because both transistors of the current mirror 520, designated in FIG. 5 as transistors Q20 and Q21, are PNP transistors. FIG. 5 illustrates an input voltage 502 and an output current 504, similar to FIG. 4.

The NPN current mirror 510 with a 1:1 ratio of the emitter area of the transistor Q11 to the emitter area of the transistor Q10 and the PNP current mirror 520 with a 2:1 ratio of the emitter area of the transistor Q21 to the emitter area of the transistor Q20 may bias the input emitter follower Q0 and the conversion resistor R0 at the same current as the output current:

$$I_{out} = \frac{V_{in}}{R_0} + \frac{|V_{BE0}| - V_{BE10}}{R_0},$$

where $V_{in}$ is the input voltage to the voltage-to-current converter 500, $I_{out}$ is the output current of the voltage-to-current converter 500, $R_o$ is the resistance of the resistor shown in the voltage-to-current converter 500, $V_{BE0}$ is the base-emitter voltage of the input transistor Q0, implemented as a PNP transistor in the illustration of FIG. 5, and $V_{BE10}$ is the base-emitter voltage of the transistor Q10, implemented as an NPN transistor in the illustration of FIG. 5.

To make an accurate voltage-to-current converter, it would be desirable to eliminate the second term on the right-hand side of the equation above, i.e., the term based on the difference in base-emitter voltages of the transistors Q0 and Q10. A base-emitter voltage of a transistor is based on a saturation current ($I_s$) of the transistor, which is one of the fundamental parameters of bipolar transistors. Typically, NPN and PNP transistors of the same dimensions (e.g., emitter area) have different saturation currents and, therefore, different base-emitter voltages. Therefore, the second term on the right-hand side of the equation above is an error term, indicating that the voltage-to-current converter 500 may suffer from the offset in base-emitter voltages ($V_{BE}$) caused by unequal saturation currents of the PNP and NPN transistors.

Difference in base-emitter voltages of the voltage-to-current converter 500 may be reduced by matching the saturation currents for NPN and PNP transistors by changing the doping profile and/or emitter area of the NPN and PNP transistors. However, this matching may not always hold over varying process, across temperature or under different operating conditions and, therefore, may still introduce errors in the voltage-to-current conversion.

In FIG. 5, the two arrows used to show the emitter of the transistor Q21 are used to represent that the ratio of the emitter area of the transistor Q21 to the emitter area of the transistor Q20 is 2:1. On the other hand, only one arrow used to show the emitter of the transistor Q11 represents that the ratio of the emitter area of the transistor Q11 to the emitter area of the transistor Q10 is 1:1. As is known in the art, said emitter ratios represent current gains of current mirrors implemented using bipolar transistors. In general, a current gain of a current mirror is a multiplication factor by which an input current, $I_{in}$, provided to the current mirror is multiplied to produce an output current, $I_{out}$, of the current mirror. A current mirror having a current gain of N means that the relationship between the input and output currents of the current mirror is $I_{out}=N \times I_{in}$. In general, the current gain of a current mirror may be any positive number greater than 0, which value may, but does not have to be, an integer. For the bipolar implementation embodiments (i.e., when input and output transistors of a current mirror are bipolar transistors), the value of a current gain of a current mirror may be indicative of (e.g., be equal to or be based on) a ratio of an area of the emitter of the output transistor to an area of the emitter of the input transistor. For example, the current gain of the current mirror 510 is based on a ratio of an area of the emitter of the output transistor Q11 to an area of the emitter of the input transistor Q10, while the current gain of the current mirror 520 is based on a ratio of an area of the emitter of the output transistor Q21 to an area of the emitter of the input transistor Q20. In the embodiments where the current gain of a current mirror is greater than 0 but less than 1, multiplying the input signal by the current gain (to generate the output signal of the current mirror) means attenuating the input signal. In the embodiments where the current gain of a current mirror is greater than 1, multiplying the input signal by the current gain (to generate the output signal of the current mirror) means increasing, or gaining, the input signal. Besides being based on the ratio of emitter areas (or aspect ratios, for FET implementations), the value of a current gain of a current mirror may further be based on the value of one or more resistors included between the first terminal (e.g., emitter) of each transistor and the supply voltage. How to use resistors in this manner to change the current gain is well known in the art and does not change the principles of operation of any of the voltage-to-current converters described herein. Therefore, such resistors are not shown in the drawings.

Figure 6:
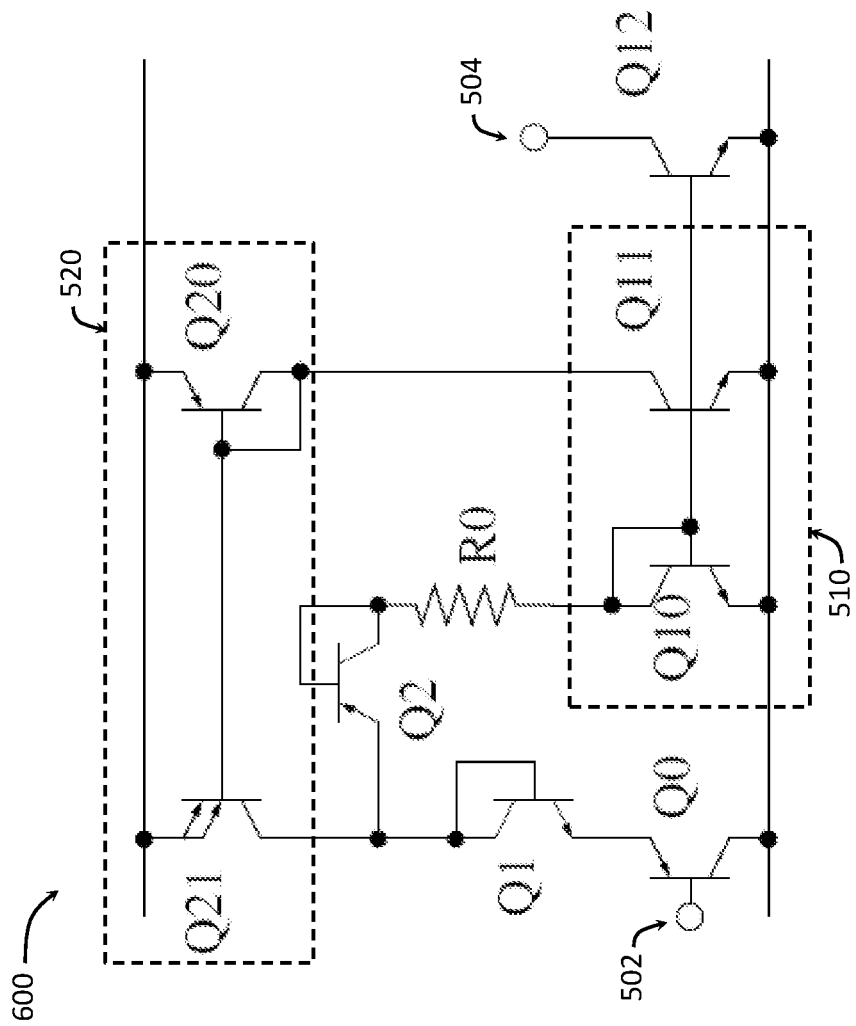
FIG. 6 is an electric circuit diagram of a voltage-to-current converter with an NPN current mirror, a PNP current mirror, and additional diode-connected transistors.

A modification to the circuit of FIG. 5 is shown in a voltage-to-current converter 600 shown in FIG. 6, where an additional diode-connected transistor has been added with each base-emitter junction in series (otherwise the converter 600 is the same as that shown in FIG. 5). These additional diode-connected transistors are shown in FIG. 6 as a transistor Q1 and a transistor Q2. While adding diode-connected transistors Q1 and Q2 may cancel the error term present in the voltage-to-current converter 500, such a solution may increase component count, require more integrated circuit chip area, and limit the maximum input voltage for a given supply voltage.

Voltage-to-Current Converters with Complementary Current Mirrors

Figure 7:
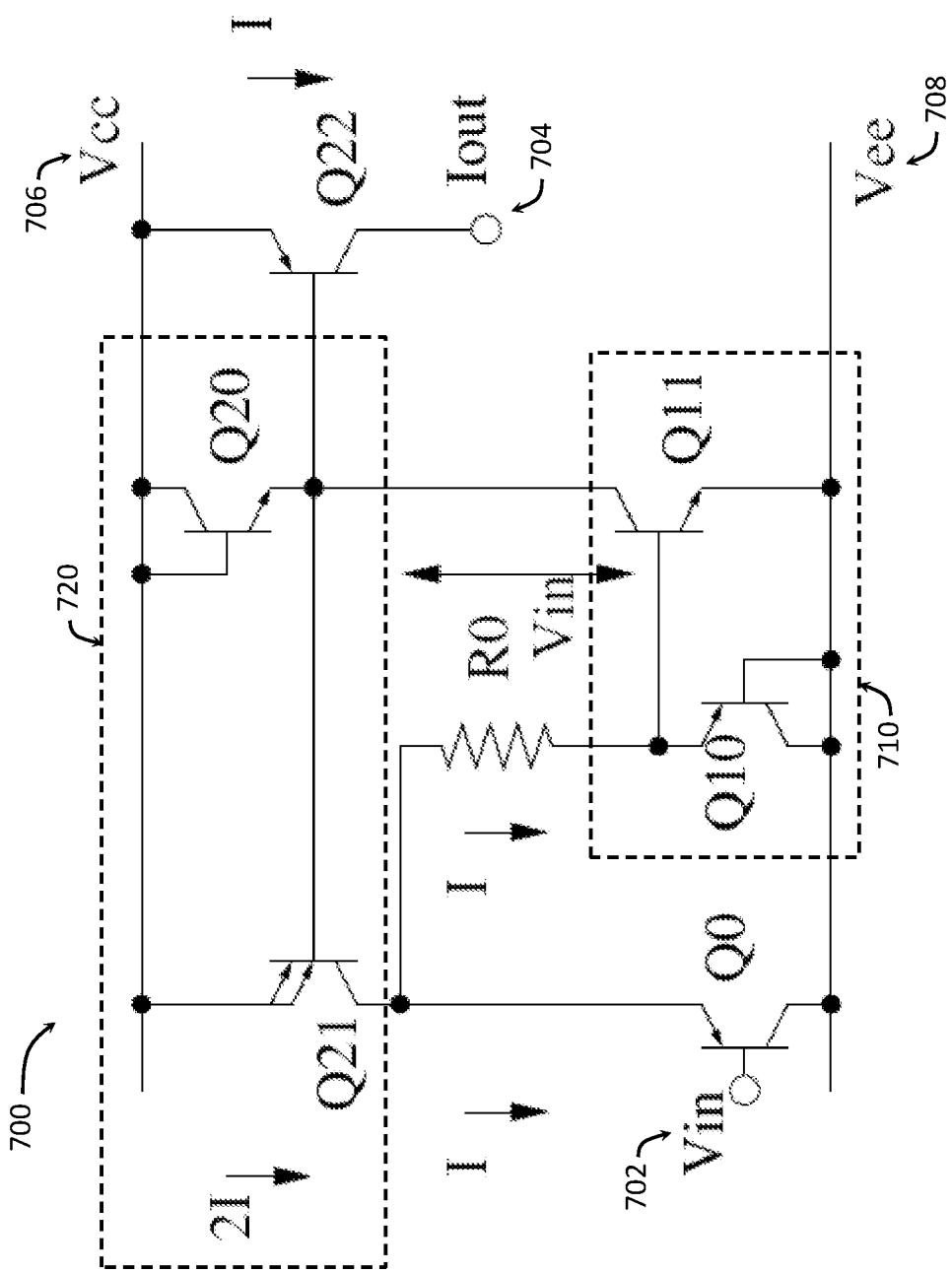
FIG. 7 is an electric circuit diagram of a voltage-to-current converter with two complementary current mirrors and a PNP transistor at the input, according to some embodiments of the present disclosure.
Figure 8:
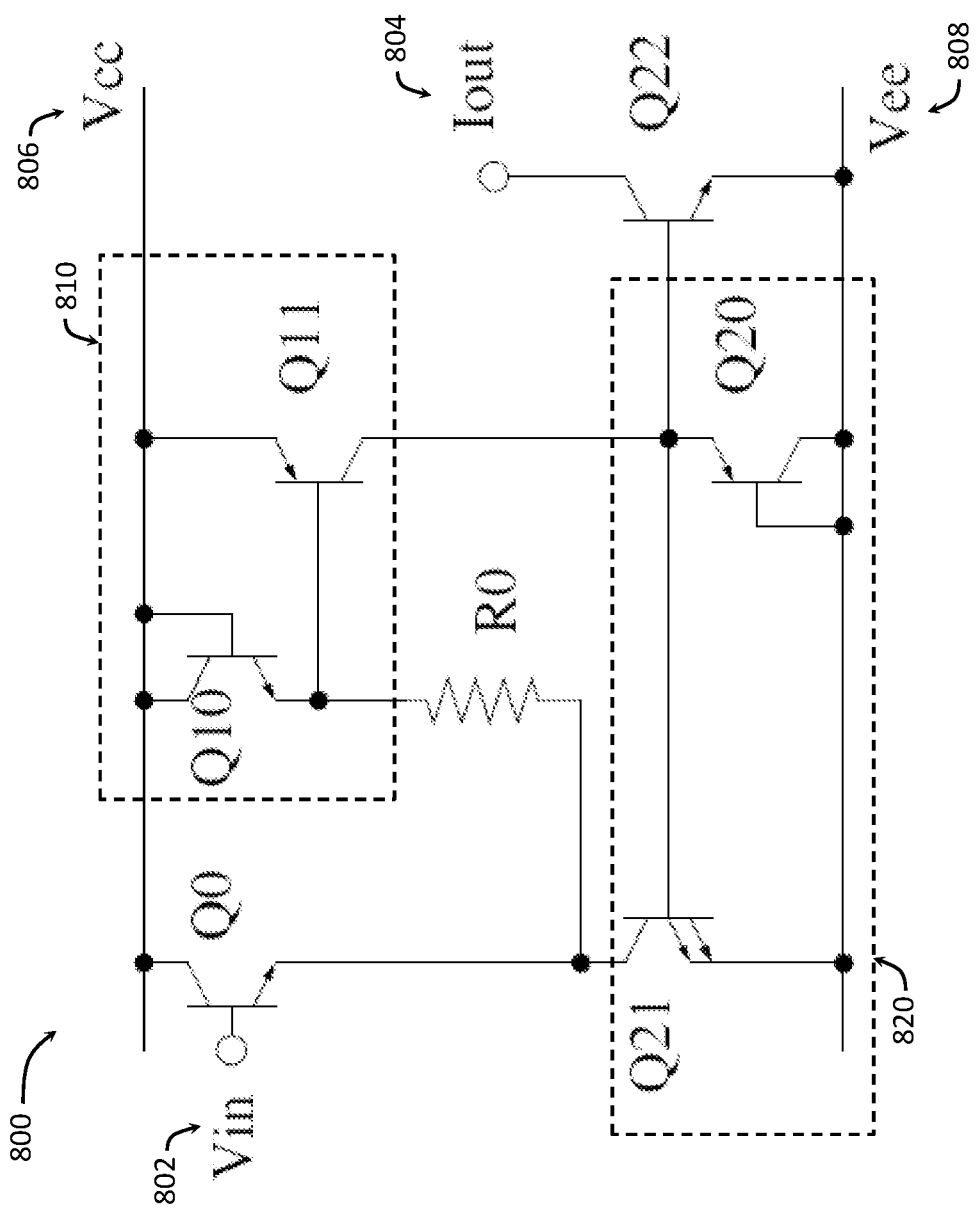
FIG. 8 is an electric circuit diagram of a voltage-to-current converter with two complementary current mirrors and an NPN transistor at the input, according to some embodiments of the present disclosure.
Figure 9:
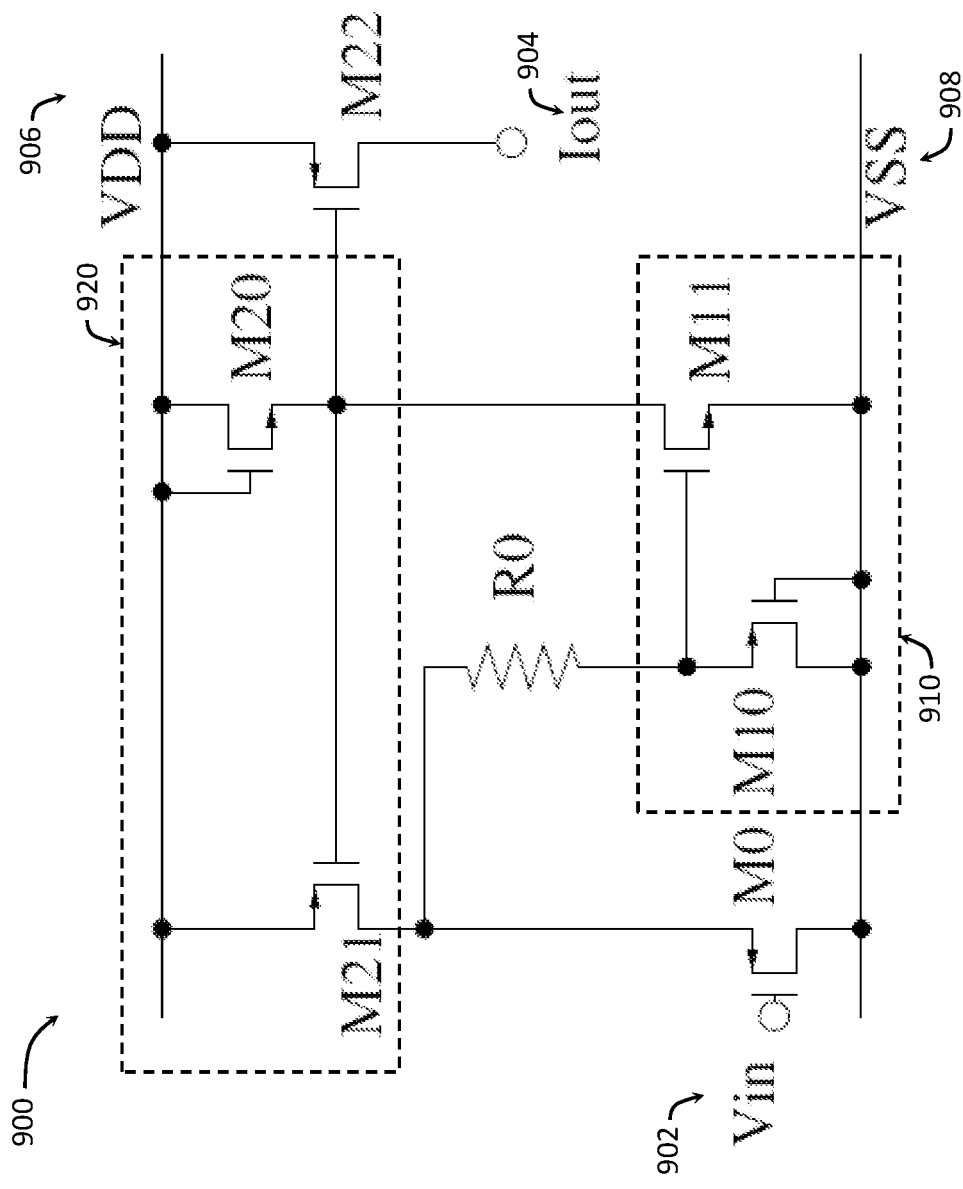
FIG. 9 is an electric circuit diagram of a voltage-to-current converter with two complementary current mirrors and a PMOS transistor at the input, according to some embodiments of the present disclosure.
Figure 10:
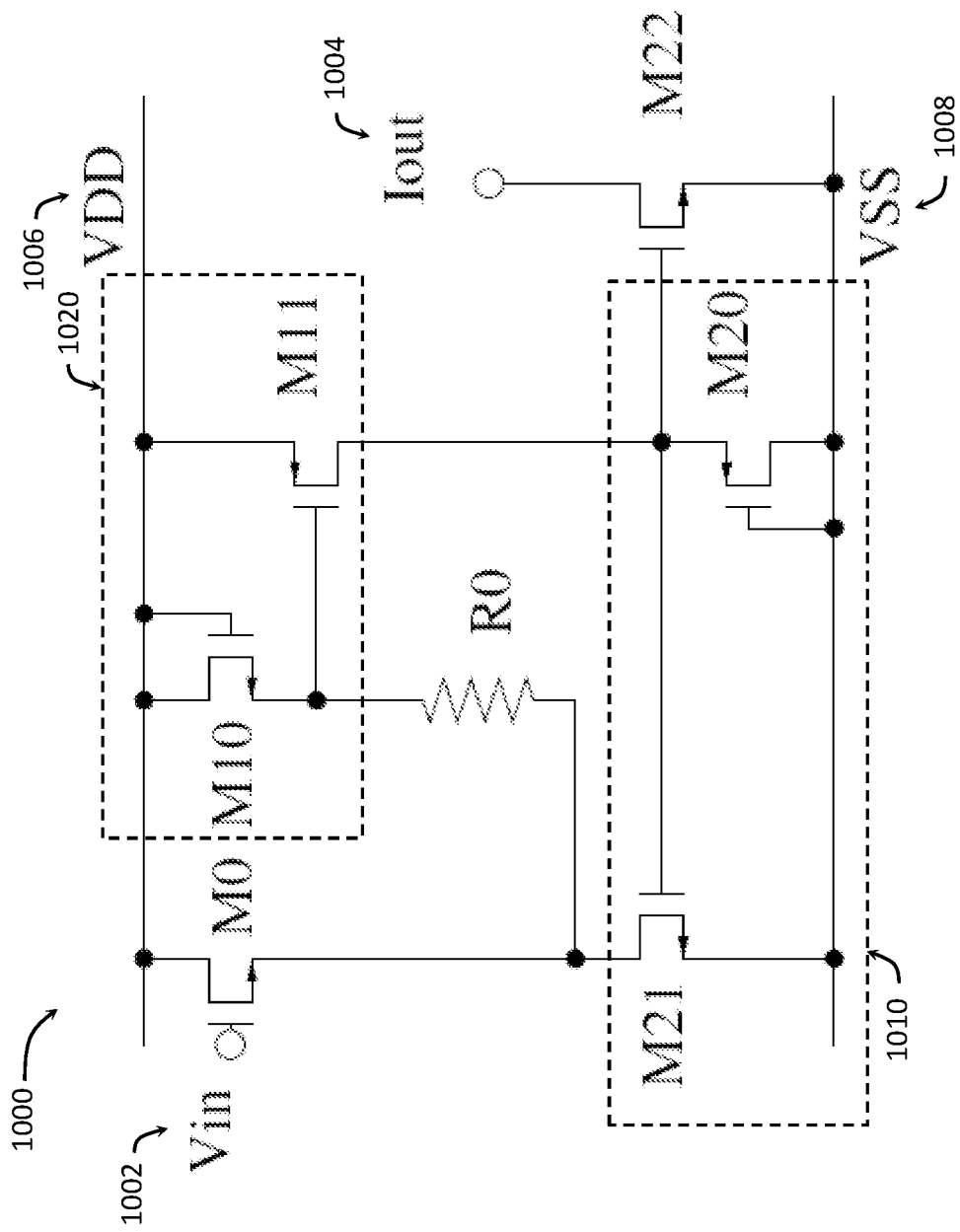
FIG. 10 is an electric circuit diagram of a voltage-to-current converter with two complementary current mirrors and an NMOS transistor at the input, according to some embodiments of the present disclosure.

Embodiments of the present disclosure are based on adapting a method to cancel the $V_{BE}$ offset between the transistors Q0 and Q10 to implement an accurate voltage-to-current converter. In particular, each of FIGS. 7-10 illustrates a voltage-to-current converter where $V_{BE}$ offset may be canceled using complementary current mirrors. FIGS. 7-10 illustrate different embodiments of such a voltage-to-current converter, where the embodiments shown in these drawings differentiate based on the technology used to implement the transistors (e.g., FIGS. 7 and 8 illustrate bipolar transistors, while FIGS. 9 and 10 illustrate FETs) and based on whether an input transistor Q0 of a voltage-to-current converter is a P-type of an N-type transistor (e.g., FIGS. 7 and 9 illustrate P-type transistors as the input transistors Q0, while FIGS. 8 and 10 illustrate N-type transistors as the input transistors Q0).

In general, any of the voltage-to-current converters with two complementary current mirrors as described herein include an input transistor for a voltage-to-current converter (e.g., the transistor Q0 for the embodiments described with reference to FIGS. 7 and 8, or the transistor M0 for the embodiments described with reference to FIGS. 9 and 10), an output transistor for a voltage-to-current converter (e.g., the transistor Q22 for the embodiments described with reference to FIGS. 7 and 8, or the transistor M22 for the embodiments described with reference to FIGS. 9 and 10), and two complementary current mirrors. Each of the two complementary current mirrors includes an input transistor (e.g., the transistor Q10 for the first complementary current mirror and the transistor Q20 for the second complementary current mirror for the embodiments described with reference to FIGS. 7 and 8, or the transistor M10 for the first complementary current mirror and the transistor M20 for the second complementary current mirror for the embodiments described with reference to FIGS. 9 and 10) and an output transistor (e.g., the transistor Q11 for the first complementary current mirror and the transistor Q21 for the second complementary current mirror for the embodiments described with reference to FIGS. 7 and 8, or the transistor M11 for the first complementary current mirror and the transistor M21 for the second complementary current mirror for the embodiments described with reference to FIGS. 9 and 10).

Similar to the voltage-to-current converter shown in FIG. 5, for any of the voltage-to-current converters with two complementary current mirrors as described herein, the input of the first complementary current mirror (i.e., the emitter/source terminal of the input transistor of the first complementary current mirror) is coupled to 1) the emitter/source terminal of the input transistor for the voltage-to-current converter via a passive electronic component having a resistance R0, referred to herein as a "resistor R0", and 2) the output of the second complementary current mirror (i.e., the collector/drain terminal (i.e., the second terminal) of the output transistor of the second complementary current mirror). Also similar to the voltage-to-current converter shown in FIG. 5, for any of the voltage-to-current converters with two complementary current mirrors as described herein, the collector/drain terminal of the output transistor of the first complementary current mirror is coupled to the emitter/source terminal of the input transistor of the second complementary current mirror.

In contrast to the voltage-to-current converter shown in FIG. 5, each of the first and second current mirrors of the embodiments described with reference to FIGS. 7-10 is a complementary current mirror in that one of the input and the output transistors is an N-type transistor and the other is a P-type transistor. Further in contrast to the voltage-to-current converter shown in FIG. 5, the type of the input transistor of the first complementary current mirror is the same as the type of the input transistor for the voltage-to-current converter and the type of the output transistor for the voltage-to-current converter, and is different from the type of the input transistor of the second complementary current mirror. Therefore, the type of the input transistor of the first complementary current mirror is the same as the type of the output transistor of the second complementary current mirror. Yet another difference with the voltage-to-current converter shown in FIG. 5, for each of the embodiments described with reference to FIGS. 7-10, the output transistor of the voltage-to-current converter is coupled to the second complementary current mirror, in particular, to each of 1) the emitter/source terminal of the input transistor of the second complementary current mirror, and 2) the base/gate terminal (i.e., the third terminal) of the output transistor of the second complementary current mirror. In this manner, the input transistor of the second complementary current mirror and the output transistor of the voltage-to-current converter form another, third, current mirror, for which the former transistor is the input transistor and the latter transistor is the output transistor.

For any of the voltage-to-current converters with two complementary current mirrors as described herein, the resistor R0 may include a plurality of components. For example, in some embodiments, the resistor R0 may include one or more diodes in series with a resistor, for a non-linear conversion. In another example, in some embodiments, the resistor R0 may include a plurality of resistors connected in parallel. In some further embodiments, such parallel resistors may be individually controlled (e.g., by a switch) to be connected or disconnected from the other resistors, in order to implement a programmable resistance R0. Thus, in general, the resistor R0 in any of the voltage-to-current converters with two complementary current mirrors as described herein may include one or more resistors in combination with any number of other components such as diodes and/or switches.

The arrangement of the transistors of various types of any of the voltage-to-current converters with two complementary current mirrors as described herein make sure that base-emitter voltages for bipolar transistor implementations (or, equivalently, gate-source voltages for FET transistor implementations) are equal for all of the transistors involved, resulting in elimination of the error term of the equation provided above. As a result, a more accurate voltage-to-current converter may be realized than that shown in FIG. 5, without having to use additional transistors (e.g., as shown in FIG. 6) and without having to implement designs with complicated variations in doping profiles and emitter areas. For example, in some embodiments of the voltage-to-current converters with complementary current mirrors, the error in copying current to the output of the converter may be limited to transistor area mismatch, which may be kept easily to less than about 5%, e.g., less than about 1%, by using transistors with large enough area and careful layout.

FIG. 7 is an electric circuit diagram of a voltage-to-current converter 700 with two complementary current mirrors 710, 720, a PNP transistor Q0 at the input, and a PNP transistor Q22 at the output, according to some embodiments of the present disclosure. The complementary current mirror 710 is formed by the bipolar transistors Q10 and Q11, where the input transistor (i.e., Q10) is a PNP transistor and the output transistor (i.e., Q11) is an NPN transistor. The complementary current mirror 720 is formed by the bipolar transistors Q20 and Q21, where the input transistor (i.e., Q20) is an NPN transistor and the output transistor (i.e., Q21) is a PNP transistor. FIG. 7 also illustrates an input 702, to which an input voltage Vin may be applied, and an output 704, which may output an output current Iout, similar to FIGS. 4 and 5. FIG. 7 further illustrates directions and relative magnitudes of currents (shown with arrows), and provides a label 706 for the voltage Vcc (i.e., the positive supply for the circuit) and a label 708 for the voltage Vee (i.e., the negative supply for the circuit). It should be noted that, in general, the voltage across the resistor R0 may be Vin−Vee. However, FIG. 7 illustrates the voltage across the resistor R0 as "Vin" to indicate that, in some embodiments, Vee may be at ground potential, in which case Vin−Vee=Vin. In the voltage-to-current converter 700, two complementary current mirrors 710, 720 may maintain all transistors at the same magnitude of base-emitter voltage. In this circuit, the transistors Q0 and Q10 are PNP transistors which may, advantageously, be biased at the same current. Therefore, the input voltage (e.g., the input voltage with respect to the negative supply Vee, i.e. Vin−Vee) may be copied on the conversion resistor R0 substantially without any errors. Consequently, the resistor current, the collector current of the input emitter follower (i.e., the collector current of the transistor Q0 shown in FIG. 7), and the output current at the output 704 of the voltage-to-current converter 700 may be (Vin−Vee)/R0.

The reasoning as to why the two complementary current mirrors of various embodiments described herein with respect to FIGS. 7-10 should be apparent to one of ordinary skill in the art based on the descriptions provided herein and the analysis of the electric circuit diagrams provided. However, for clarity, it will be explained with reference to the embodiment shown in FIG. 7 (analogous explanations are applicable to the embodiments shown in FIGS. 8-10). In the voltage-to-current converter 700, transistors Q0 and Q10 are transistors of the same type (namely, both are P-type transistors), which means that they may be biased at the same current. Since Q0 and Q10 further have the same dimensions (e.g., the same emitter area), Q0 and Q10 have the same base-to-emitter voltages, i.e., $V_{BE0}=V_{BE10}$. The transistors Q10 and Q11 form the first complementary current mirror. In a non-complementary current mirror (i.e., in a current mirror where the input and output transistors are of the same type, both either N-type or P-type), the input current to the current mirror biases the input transistor to a certain baseto-emitter voltage. Since both the input and output transistors of a non-complementary current mirror are of the same type and are biased at the same base-to-emitter voltage, the input and output transistor have the same current density. If the input and output transistors of a non-complementary current mirror have the same emitter area, the input and output currents would be equal in magnitude. Similar to a non-complementary current mirror, in a complementary current mirror both the input transistor and the output transistor have the same magnitude of base-to-emitter voltage (the same magnitude but different polarity, e.g., $V_{BE}$ may be positive for NPN transistors but negative for PNP transistors), but because the input and output transistor are of opposite types, their collector currents are not equal. For example, for the complementary current mirror 710, $V_{BE11}=-V_{BE10}$, and, for complementary current mirror 720, $-V_{BE21}=V_{BE20}$, where, as used herein, the digits in the notation for various base-emitter voltages $V_{BE}$ refer to the digits of the transistor to which each voltage corresponds (e.g., $V_{BE11}$ is the base-emitter voltage of the transistor Q11, $V_{BE21}$ is the base-emitter voltage of the transistor Q21, and so on). Since Q11 and Q20 are biased at the same current, Q11 and Q20 also have the same base-to-emitter voltage, and, therefore, $V_{BE11}=-V_{BE10}=V_{BE20}=-V_{BE21}$. Thus, all of the transistors shown in FIG. 7 have the same magnitude of their base-to-emitter voltages.

FIG. 8 is an electric circuit diagram of a voltage-to-current converter 800 with two complementary current mirrors 810, 820, an NPN transistor Q0 at the input, and an NPN transistor Q22 at the output, according to some embodiments of the present disclosure. The complementary current mirror 810 is formed by the bipolar transistors Q10 and Q11, where the input transistor (i.e., Q10) is an NPN transistor and the output transistor (i.e., Q11) is a PNP transistor. The complementary current mirror 820 is formed by the bipolar transistors Q20 and Q21, where the input transistor (i.e., Q20) is a PNP transistor and the output transistor (i.e., Q21) is an NPN transistor. FIG. 8 also illustrates an input 802, to which an input voltage Vin may be applied, and an output 804, which may output an output current Iout, similar to FIG. 7. Although not specifically shown in FIG. 8, relative magnitudes of base-emitter voltages in the voltage-to-current converter 800 would be analogous to that those shown in FIG. 7, while the sign of base-emitter voltages of various transistors would be opposite to those shown in FIG. 7 (because all PNP transistors of FIG. 7 are replaced with NPN transistors and all NPN transistors of FIG. 7 are replaced with PNP transistors to arrive at the voltage-to-current converter shown in FIG. 8). FIG. 8 further provides a label 806 for the voltage Vcc (i.e., the positive supply for the circuit) and providing a label 808 for the voltage Vee (i.e., the negative supply for the circuit), where the designation of Vcc and Vee in FIG. 8 is reversed compared to FIG. 7. Similar to the voltage-to-current converter 700, in the voltage-to-current converter 800, two complementary current mirrors 810, 820 may maintain all transistors at the same magnitude of base-emitter voltage. In this circuit, the transistors Q0 and Q10 are NPN transistors which may, advantageously, be biased at the same current. Therefore, the input voltage (e.g., the input voltage with respect to the positive supply Vcc, i.e. Vcc−Vin) may be copied on the conversion resistor R0 substantially without any errors. Consequently, the resistor current, the collector current of the input emitter follower (i.e., the collector current of the transistor Q0 shown in FIG. 8), and the output current at the output 804 of the voltage-to-current converter 800 may be (Vcc−Vin)/R0.

Similar to FIG. 5, in FIGS. 7 and 8, the two arrows used to show the emitter of the transistor Q21 are used to represent that, in some embodiments, the emitter area of the transistor Q21 is twice that of other transistors shown in the drawing with one arrow. For example, in some embodiments, the emitter area of the transistor Q21 may be twice the emitter area of any of the transistors Q0, Q10, and Q22, resulting in the same current density (i.e., current per area) for each of the PNP/NPN transistors in the voltage-to-current converter 700/800. In other embodiments, one or more ratios of emitter areas of various transistors in the voltage-to-current converter 700/800 could be different to achieve desired attenuation or gain in the current at the output 704/804. For example, increasing the emitter area of the output transistor Q22 to be N/2 times the emitter area of the transistor Q21, where N is greater than 1, would result in the N times increase in the current at the output 704/804. Such embodiment may be useful if, e.g., the voltage-to-current converters 700/800 are used to amplify currents corresponding to voltage signals generated by various sensors.

FIG. 9 is an electric circuit diagram of a voltage-to-current converter 900 with two complementary current mirrors 910, 920, a PMOS transistor M0 at the input, and a PMOS transistor M22 at the output, according to some embodiments of the present disclosure. The voltage-to-current converter 900 is analogous to the voltage-to-current converter 700, except that all PNP transistors of the converter 700 are replaced with PMOS transistors, all NPN transistors of the converter 700 are replaced with NMOS transistors, Vcc is replaced with VDD, and Vee is replaced with VSS to arrive at the converter 900. The complementary current mirror 910 is formed by the FETs M10 and M11, where the input transistor (i.e., M10) is a PMOS transistor and the output transistor (i.e., M11) is an NMOS transistor. The complementary current mirror 920 is formed by the FETs M20 and M21, where the input transistor (i.e., M20) is an NMOS transistor and the output transistor (i.e., M21) is a PMOS transistor. FIG. 9 also illustrates an input 902, to which an input voltage Vin may be applied, and an output 904, which may output an output current Iout, similar to FIGS. 7 and 8. FIG. 9 further provides a label 906 for the voltage VDD (i.e., the positive supply for the circuit) and a label 908 for the voltage VSS (i.e., the negative supply for the circuit). In the bipolar transistor implementation of the embodiment of FIG. 7, emitter areas were used to set the current gain of the current mirrors. When current mirrors are implemented using FETs this may be done by controlling the ratio of channel width to channel length. In particular, for the FET implementation embodiments (i.e., when input and output transistors of a current mirror are FETs), the value of a current gain of a current mirror may be indicative of a ratio of the aspect ratio of the output transistor to the aspect ratio of the input transistor, where an aspect ratio of a FET may be defined as a channel width (W) of the transistor divided by its' channel length (L). For example to bias the transistors M0 and M10 of the voltage-to-current converter 900 at the same current, one may set the following ratios: (W/L)_M0=(W/L)_M10=(W/L)_M22=½*(W/L)_M21 and (W/L)_M11=(W/L)_M20. In this circuit, the transistors M0 and M10 are PMOS transistors which may, advantageously, be biased at the same current. Therefore, the input voltage (e.g., the input voltage with respect to the negative supply VSS, i.e. Vin-VSS) may be copied on the conversion resistor R0 substantially without any errors. Consequently, the resistor current, the drain current of the input transistor M0 shown in FIG. 9, and the output current at the output 904 of the voltage-to-current converter 900 may be (Vin−VSS)/R0.

FIG. 10 is an electric circuit diagram of a voltage-to-current converter 1000 with two complementary current mirrors 1010, 1020, an NMOS transistor M0 at the input, and an NMOS transistor M22 at the output, according to some embodiments of the present disclosure. The complementary current mirror 1010 is formed by the FETs M10 and M11, where the input transistor (i.e., M10) is an NMOS transistor and the output transistor (i.e., M11) is a PMOS transistor. The complementary current mirror 1020 is formed by the bipolar transistors M20 and M21, where the input transistor (i.e., M20) is a PMOS transistor and the output transistor (i.e., M21) is an NMOS transistor. FIG. 10 also illustrates an input 1002, to which an input voltage Vin may be applied, and an output 1004, which may output an output current Iout, similar to FIG. 9. FIG. 10 further provides a label 1006 for the voltage VDD (i.e., the positive supply for the circuit) and a label 1008 for the voltage VSS (i.e., the negative supply for the circuit). In the bipolar transistor embodiment of FIG. 8, emitter areas were used to set the current ratios. In FET implementations, this may be done by controlling the ratio of gate width to gate length. For example, to bias M0 and M10 of the voltage-to-current converter 1000 at the same current, one may set the following ratios: (W/L)_M0=(W/L)_M10=(W/L)_M22=½*(W/L)_M21 and (W/L)_M11=(W/L)_M20. In this circuit, the transistors M0 and M10 are NMOS transistors which may, advantageously, be biased at the same current. Therefore, the input voltage (e.g., the input voltage with respect to the positive supply VDD, VDD−Vin) may be copied on the conversion resistor R0 substantially without any errors. Consequently, the resistor current, the drain current of the input transistor M0 shown in FIG. 10, and the output current at the output 1004 of the voltage-to-current converter 1000 may be (VDD−Vin)/R0.

Similar to FIGS. 7 and 8, certain aspect ratios of various transistors may be described with respect to the embodiments of FIGS. 9 and 10. For example, a ratio of the aspect ratio (i.e., W/L) of the transistor M21 to the aspect ratio of the transistor M0 and M10 may be 2:1, resulting in the same current per channel width, assuming the same channel length, for each of the PMOS/NMOS transistors M0, M10, and M21 in the voltage-to-current converter 900/1000. On the other hand, a ratio of the aspect ratio of the transistor M11 to the aspect ratio of the transistor M20 may be 1:1, resulting in the same current per channel width, assuming same channel length, for each of the NFET/PFET transistors M11 and M20 in the voltage-to-current converter 900/1000. Similarly, a ratio of the aspect ratio of the transistor M22 to the aspect ratio of the transistor M21 may be 1:2, resulting in the same current density for the output transistor M22. In other embodiments of the voltage-to-current converters 900/1000, one or more of these ratios of aspect ratios of various transistors could be different to achieve desired attenuation or gain in the current at the output 904/1004 of the voltage-to-current converters 900/00. For example, increasing the aspect ratio of the output transistor M22 to be N/2 times the aspect ratio of the transistor M21, where N is greater than 1, would result in the N times increase in the current at the output 904/1004. Such embodiment may be useful if, e.g., the voltage-to-current converters 900/1000 are used to amplify currents corresponding to voltage signals generated by various sensors.

Furthermore, although each of FIGS. 7-10 illustrates either bipolar transistors or FETs used, in other embodiments of any of the voltage-to-current converters with complementary current mirrors described herein may be implemented with any combination of bipolar transistors and FETS. For example, in some embodiments, any of the first complementary current mirrors described herein may be implemented using bipolar transistors, while the second complementary current mirrors described herein may be implemented using FETS, and so on.

As the foregoing illustrates, FIGS. 7-10 illustrate some embodiments of compact and accurate voltage-to-current converters that can operate at low-voltage while consuming minimal power, suitable for modern LIDAR receivers with numerous channels. TIA developed for LIDAR receivers will benefit from input offset cancellation and output offset current adjust that can be controlled with external voltages.

Example Systems

Figure 11:
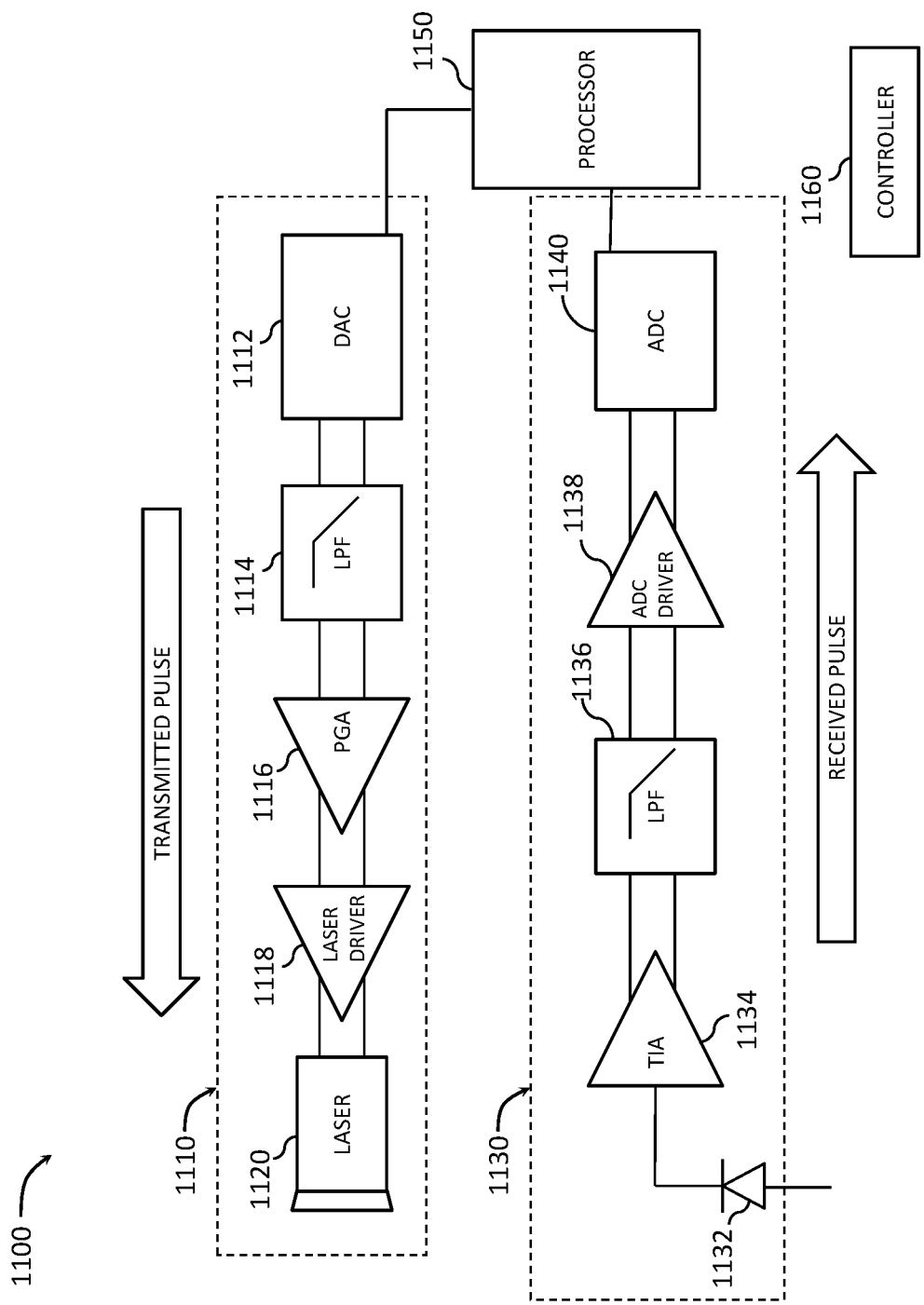
FIG. 11 is a schematic diagram of an example LIDAR system, according to some embodiments of the present disclosure.

Various embodiments of voltage-to-current converters with complementary current mirrors as described above may be implemented in any kind of system where conversion of voltage to current may be used. One example of such a system is shown in FIG. 11, providing a block diagram of an example LIDAR system 1100 according to an embodiment. As shown in FIG. 11, system 1100 may include a transmitter signal chain 1110, a receiver signal chain 1130, a processor 1150, and a controller 1160. In some instances, the receiver signal chain 1130 can be implemented separately from the transmitter signal chain 1110. As shown in FIG. 11, the transmitter signal chain 1110 may include a digital-to-analog converter (DAC) 1112, a low pass filter (LPF) 1114, a programmable gain amplifier (PGA) 1116, a laser driver 1118, and a laser 1120. The receiver chain 1130 may include an optical sensor, e.g., a photodiode (PD) 1132, a TIA 1134, an LPF 1136, an analog-to-digital converter (ADC) driver 1138, and an ADC 1140. In some instances, a receiver chain can include a PGA coupled between the TIA 1134 and the LPF 1136. Such a PGA could be implemented in place of or in addition to the ADC driver 1138.

The processor 1150 may be configured to generate a digital signal indicating that a laser pulse is to be emitted by the laser 1120. The digital signal from the processor 1150 may then be converted to an analog signal by the DAC 1112, further processed by the optional LPF 1114, amplified by the PGA 1116, and provided to the laser driver 1118. The laser 1120 may be, e.g., a laser diode.

The light emitted by the laser 1120 can reach an object or a target and reflected light can be received by the optical sensor 1132 of the receiver signal chain 1130. Thus, the reflected light can be detected at the optical sensor 1132. The optical sensor 1132 can be an avalanche photodiode (APD), for example. The optical sensor 1132 can generate a current pulse indicative of the received reflected light and the current pulse may be converted to a voltage pulse by the TIA 1134 and, optionally, further processed by the LPF 1136. The LPF 1136 can be a tunable filter in certain embodiments. As illustrated, the LPF 1136 may be coupled in a signal path between the TIA 1134 and the ADC driver 1138. In some other implementations, the LPF 1136 can be coupled in a signal path between the ADC driver 1138 and the ADC 1140. The ADC driver 1138 generate a drive signal, based on the output of the TIA 1134, to drive the ADC 1140. The ADC 1140 can convert the received drive signal to a digital signal, to further be processed by the processor 1150.

Any of the voltage-to-current converters may be implemented within, or associated with the TIA 1134, similar to how it was described for the TIA 104 shown in FIG. 1. The timing of various operations of the LIDAR system 1100 may be controlled by the controller 1160. In particular, the controller 1160 may be configured to control the timing of when any of the voltage-to-current converters with complementary current mirrors as described herein are activated/turned on to generate current output used as an input and/or output offset current for the TIA 1134. For example, the controller 1160 may be configured to control the timing of when any of the voltage-to-current converters with complementary current mirrors as described herein are turned on to provide an input offset current to the amplifier circuit of the TIA 1134, e.g., to cancel DC current generated by the optical sensor 1132 in response to sensing ambient light. In another example, the controller 1160 may be configured to control the timing of when any of the voltage-to-current converters with complementary current mirrors as described herein are turned on to provide an output offset current to the amplifier circuit of the TIA 1134, e.g., to tilt the output of the TIA 1134 in order to better utilize the input signal range of the ADC 1140. In some embodiments, the controller 1160 may be pre-programmed with the times when to turn on and off the various voltage-to-current converters with complementary current mirrors included in the LIDAR system 1100. In other embodiments, one or more sensors may be used to sense the state of various portions of the LIDAR system 1100 and provide information to the controller 1160 so that the controller 1160 can use this information to turn on and off the various voltage-to-current converters with complementary current mirrors as described herein.

In some embodiments, the processor 1150 can be a hardware processor. In some embodiments, the processor 1150 can be a baseband digital signal processor. In some embodiments, the processor 1150 can determine a distance between an object and the laser range finding system 1100. In some embodiments, the processor 1150 can output a signal indicative of the determined distance. In some embodiments, the processor 1150 can identify an object from which the pulse of light reflected from the object based at least partly on the width of a pulse generated by the TIA 1134. In some embodiments, the processor 1150 can output data identifying the object. In some embodiments, one instance of the processor 1150 may be associated with the receiver signal chain 1130 and another instance of the processor 1150 may be associated with the transmitter signal chain 1110.

Figure 12:
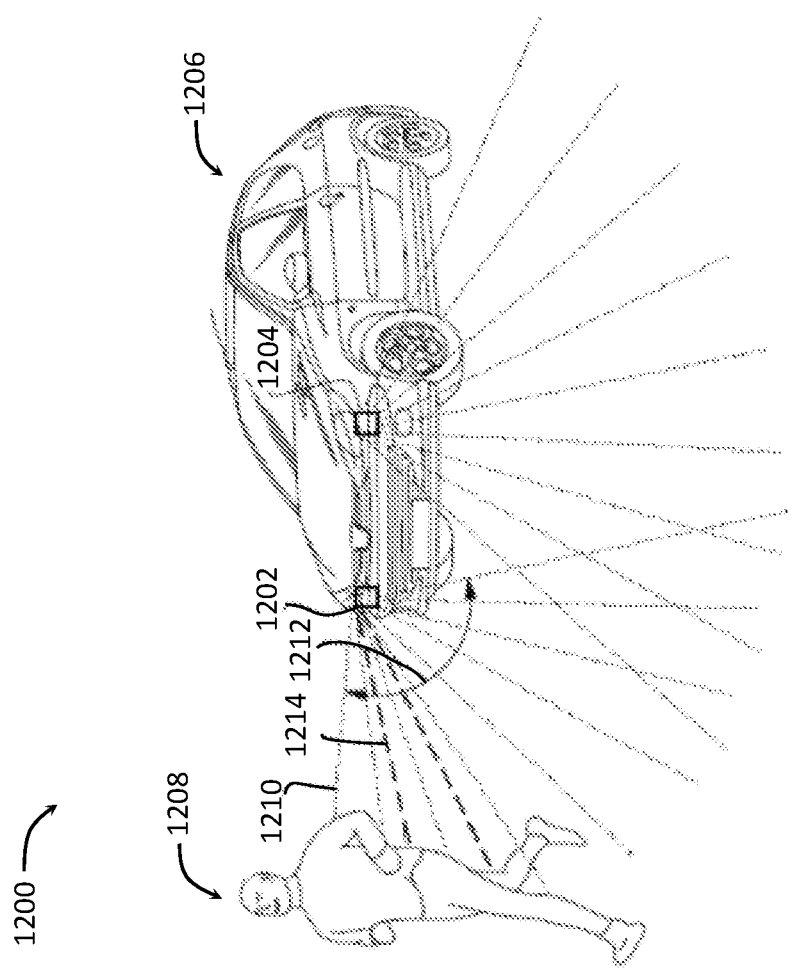
FIG. 12 is an illustration of a LIDAR system integrated with an automobile, according to some embodiments of the present disclosure.

FIG. 12 provides an illustration 1200 of a LIDAR system integrated with an automobile, according to some embodiments of the present disclosure. This is an example application in which voltage-to-current converters with complementary current mirrors as described herein can be implemented. FIG. 12 illustrates two LIDAR systems 1202 and 1204 integrated with an automobile 1206. The first LIDAR system 1202 may be positioned near a right headlight of the automobile 1206 and the second LIDAR system 1204 may be positioned near the left headlight of automobile 1206. The LIDAR systems 1202 and/or 1204 can implement any suitable principles of the voltage-to-current converters with complementary current mirrors, as discussed herein, e.g., by implementing one or more voltage-to-current converters with complementary current mirrors in any of the TIAs of the LIDAR systems 1202 and/or 1204. The LIDAR systems 1202 and/or 1204 can detect a distance between the automobile 1206 and an object 1208.

As illustrated, a transmitter of the LIDAR system 1202 can transmit pulses of light 1210 at an angle 1212. At least some of the pulses of light 1210 may be generated by a laser diode, e.g., the laser 1120, shown in FIG. 11. The transmitted light 1210 can travel through the air and reach the object 1208. The object 1208 can reflect back pulses of light 1214 to a receiver of the LIDAR system 1202. Embodiments discussed herein can generate information to identify the object 1208. The pulses of light 1210 can be transmitted three dimensionally to obtain three-dimensional information of the surroundings.

One or more additional LIDAR systems can be integrated with the automobile 1206 to cover a wider range of area for detection and/or to obtain additional information regarding a selected area. In some embodiments, data collected by each LIDAR system can be combined to analyze information from a wider range of area and/or to provide additional information about a selected area. In some embodiments, the angle 1212 can be adjusted and the angle 1212 can be in any suitable range.

The illustrations of FIGS. 11-12 provide just some non-limiting example where voltage-to-current converters with complementary current mirrors as described herein may be used. Various teachings related to voltage-to-current converters with complementary current mirrors as described herein are applicable to a large variety of other systems. In some scenarios, various embodiments of voltage-to-current converters with complementary current mirrors as described herein can be used in automotive systems, safety-critical industrial applications, medical systems, scientific instrumentation, wireless and wired communications, radar, industrial process control, audio and video equipment, current sensing, instrumentation (which can be highly precise), and various digital-processing-based systems. In other scenarios, various embodiments of voltage-to-current converters with complementary current mirrors as described herein can be used in the industrial markets that include process control systems that help drive productivity, energy efficiency, and reliability. In yet further scenarios, various embodiments of voltage-to-current converters with complementary current mirrors may be used in consumer applications.

Select Examples

The following paragraphs provide examples of various ones of the embodiments disclosed herein.

Example A1 provides a voltage-to-current converter that includes a first current mirror and a second current mirror. The first current mirror includes a first transistor of a first type and a second transistor of a second type, where one of the first and second types of transistors is an N-type transistor and the other one is a P-type transistor. The second current mirror includes a first transistor of the first type of majority carriers and the second transistor of a second type of majority carriers.

Example A2 provides the voltage-to-current converter according to example A1, wherein the first type of transistors are P-type transistors and the second type of transistors are N-type transistors.

Example A3 provides the voltage-to-current converter according to examples A1 or A2, further comprising an input transistor.

Example A4 provides the voltage-to-current converter according to any one of examples A1-A3, wherein the voltage-to-current converter includes coupling between the first and second current mirrors as shown in FIG. 7.

Example A5 provides the voltage-to-current converter according to any one of examples A1-A3, wherein the voltage-to-current converter includes coupling between the first and second current mirrors as shown in FIG. 8.

Example A6 provides the voltage-to-current converter according to any one of examples A1-A3, wherein the voltage-to-current converter includes coupling between the first and second current mirrors as shown in FIG. 9.

Example A7 provides the voltage-to-current converter according to any one of examples A1-A3, wherein the voltage-to-current converter includes coupling between the first and second current mirrors as shown in FIG. 10.

Example A8 provides an electronic component comprising a voltage-to-current converter according to any one of the preceding examples A.

Example A9 provides the electronic component according to example A8, wherein the voltage-to-current converter is to provide an input offset current to an amplification circuit, e.g., to cancel DC current generated by an optical sensor in response to sensing ambient light.

Example A10 provides the electronic component according to example A8, wherein the voltage-to-current converter is to provide an output offset current to an amplification circuit and/or an amplifier.

Example A11 provides the electronic component according to any one of examples A8-A10, wherein the electronic component is a transimpedance amplifier.

Example A12 provides the electronic component according to any one of examples A8-A10, wherein the electronic component is a LIDAR receiver.

Example B1 provides a system configured to convert a voltage signal to a current signal, the system including an input transistor, configured to receive the voltage signal as an input; a first current mirror, having a first mirror input transistor and a first mirror output transistor; and a second current mirror, having a second mirror input transistor and a second mirror output transistor. In such a system, the first mirror input transistor is coupled to the input transistor via a resistor, the first mirror output transistor is coupled to the second mirror input transistor, the second mirror output transistor is coupled to the input transistor, the second current mirror is configured to provide the current signal to an output, one of the first mirror input transistor and the first mirror output transistor is a transistor of an N-type and the other one is a transistor of a P-type, and one transistor of the second mirror input transistor and the second mirror output transistor is a transistor of the N-type and the other one is a transistor of the P-type.

Example B2 provides the system according to example B1, where the input transistor is a transistor of a type that is same as the first mirror input transistor (i.e., either both are P-type transistors, or both are N-type transistors).

Example B3 provides the system according to examples B1 or B2, where the second mirror output transistor is a transistor of a type that is same as the first mirror input transistor (i.e., either both are P-type transistors, or both are N-type transistors).

Example B4 provides the system according to any one of the preceding examples B, where the first mirror output transistor is a transistor of a type that is same as the second mirror input transistor (i.e., either both are P-type transistors, or both are N-type transistors).

Example B5 provides the system according to any one of the preceding examples B, further including an output transistor, where the second current mirror is configured to provide the current signal to the output by mirroring a current signal through the second mirror input transistor to the output transistor.

Example B6 provides the system according to example B5, where the second mirror input transistor is an input transistor of a third current mirror and the output transistor is an output transistor of a third current mirror.

Example B7 provides the system according to examples B5 or B6, where the output transistor is a transistor of a type that is same as the input transistor (i.e., either both are P-type transistors, or both are N-type transistors), and the same as the first mirror input transistor.

Example B8 provides the system according to any one of the preceding examples B, where each of the input transistor, the first mirror input transistor, the first mirror output transistor, the second mirror input transistor, and the second mirror output transistor includes a first terminal, a second terminal, and a third terminal. In such a system, the first terminal of the input transistor is coupled to each of the second terminal of the second mirror output transistor and a first terminal of the resistor, the first terminal of the first mirror input transistor is coupled to each of the third terminal of the first mirror output transistor and a second terminal of the resistor, and the second terminal of the first mirror output transistor is coupled to each of the first terminal of the second mirror input transistor and the third terminal of the second mirror output transistor.

Example B9 provides the system according to example B8, further including an output transistor, where the output transistor includes a first terminal, a second terminal, and a third terminal, and where the third terminal of the output transistor is coupled to each of the first terminal of the second mirror input transistor and the third terminal of the second mirror output transistor, and the second current mirror is configured to provide the current signal to the output by mirroring a current signal at the first terminal of the second mirror input transistor to the second terminal of the output transistor.

Example B10 provides the system according to examples B8 or B9, where, for each of the input transistor, the first mirror input transistor, the first mirror output transistor, the second mirror input transistor, and the second mirror output transistor that is implemented as a bipolar transistor, the first terminal is an emitter terminal, the second terminal is a collector terminal, and the third terminal is a base terminal.

Example B11 provides the system according to examples B8 or B9, where, for each of the input transistor, the first mirror input transistor, the first mirror output transistor, the second mirror input transistor, and the second mirror output transistor that is implemented as a field-effect transistor, the first terminal is a source terminal, the second terminal is a drain terminal, and the third terminal is a gate terminal.

Example B12 provides a system configured to convert a voltage signal to a current signal, the system including an input transistor, configured to receive the voltage signal as an input; an output transistor, configured to provide the current signal as an output; a first current mirror, coupled to the input transistor; and a second current mirror, coupled to the first current mirror and to the output transistor, where each of the first current mirror and the second current mirror is a complementary current mirror.

Example B13 provides the system according to example B12, where each of the first current mirror and the second current mirror includes a mirror input transistor and a mirror output transistor, each of the input transistor, the mirror input transistor of the first current mirror, the mirror output transistor of the second current mirror, and the output transistor is a P-type transistor, and each of the mirror output transistor of the first current mirror and the mirror input transistor of the second current mirror is an N-type transistor.

Example B14 provides the system according to example B12, where each of the first current mirror and the second current mirror includes a mirror input transistor and a mirror output transistor, each of the input transistor, the mirror input transistor of the first current mirror, the mirror output transistor of the second current mirror, and the output transistor is an N-type transistor, and each of the mirror output transistor of the first current mirror and the mirror input transistor of the second current mirror is a P-type transistor.

Example B15 provides the system according to example B13 or B14, where the system further includes a resistive element having a first terminal and a second terminal, and the first current mirror is coupled to the input transistor by the input transistor being coupled to the first terminal of the resistive element and the second terminal of the resistive element being coupled to the first mirror input transistor.

Example B16 provides the system according to any one of examples B13-B15, where the second mirror output transistor is coupled to the input transistor, and the second mirror input transistor is coupled to the first mirror output transistor.

Example B17 provides the system according to any one of examples B13-B16, where the second mirror input transistor is an input transistor of a third current mirror, and the output transistor is an output transistor of the third current mirror.

Example B18 provides the system according to any one of the preceding examples B, where the system is a voltage-to-current converter for a TIA.

Example B19 provides the system according to any one of the preceding examples B, where the system is a LIDAR system.

Example B20 provides an electronic component that includes an amplifier circuit and a voltage-to-current converter having a first complementary current mirror and a second complementary current mirror, coupled to the first complementary current mirror, the voltage-to-current converter configured to generate a current output in response to a voltage input, where the current output is configured to provide an input offset current to the amplifier circuit, e.g., to cancel DC current generated by an optical sensor in response to sensing ambient light, and/or provide an output offset current to the amplifier circuit.

Example B21 provides the electronic component according to example B20, where each of an input transistor of the first complementary current mirror and an output transistor of the second complementary current mirror is a P-type transistor and each of an output transistor of the first complementary current mirror and an input transistor of the second complementary current mirror is an N-type transistor, or each of an input transistor of the first complementary current mirror and an output transistor of the second complementary current mirror is an N-type transistor and each of an output transistor of the first complementary current mirror and an input transistor of the second complementary current mirror is a P-type transistor.

Example B22 provides the electronic component according to examples B20 or B21, where the electronic component is a TIA or a LIDAR receiver.

Example B23 provides a method, including steps performed by a system or an electronic component according to any one of the preceding examples.

Example B24 provides a method, including steps that cause a system to operate according to any one of the preceding examples.

Example B25 provides a non-transitory computer-readable storage medium storing instructions which, when executed by a processor, cause the processor to perform at least portions of the methods according to any one of examples B23-B24.

Example B26 provides a computer program product including instructions which, when executed by a processor, cause the processor to perform at least portions of the methods according to any one of examples B23-B24.

Other Implementation Notes, Variations, and Applications

Principles and advantages discussed herein can be used in any device where voltage-to-current conversion may need to take place. For example, aspects of this disclosure can be implemented in various range finding systems. For example, aspects of this disclosure can be implemented in any suitable LIDAR system such as, for example, automotive LIDAR, industrial LIDAR, space LIDAR, military LIDAR, etc. LIDAR systems can include a receiver or a transmitter and a receiver. LIDAR systems can be integrated with a vehicle, such as an automobile, a drone such as an unmanned flying machine, an autonomous robot, or a space vehicle. LIDAR systems can transmit and/o receive laser light. LIDAR systems can be used for three-dimensional sensing applications. LIDAR systems can be used with augmented reality technology. Moreover, aspects of this disclosure can be implemented in various electronic devices. Examples of the electronic devices can include, but are not limited to, electronic products, parts of electronic products such as integrated circuits, vehicular electronics such as automotive electronics, etc. Further, the electronic devices can include unfinished products.

While certain embodiments have been described, these embodiments have been presented by way of example, and are not intended to limit the scope of the disclosure. For example, while some embodiments refer to an APD being coupled to an input port of a TIA, these embodiments are equally applicable to any other device that can generate current pulses to be provided to an input of a TIA, e.g., to any other type of a PD. In another example, while some embodiments refer to a PD that sinks current from the TIA, these embodiments may be modified, in a way that would be obvious to a person of ordinary skill in the art, to a PD that sources current to the TIA, all of which embodiments being, therefore, within the scope of the present disclosure. Indeed, the novel methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

Any of the principles and advantages discussed herein can be applied to other systems, devices, integrated circuits, electronic apparatus, methods, not just to the embodiments described above. The elements and operations of the various embodiments described above can be combined to provide further embodiments. The principles and advantages of the embodiments can be used in connection with any other systems, devices, integrated circuits, apparatus, or methods that could benefit from any of the teachings herein.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

In one example embodiment, any number of electrical circuits of the FIGS. may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, controllers for configuring any of the components, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGS. may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGS. may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGS. and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended select examples. Note that all optional features of the apparatus described above may also be implemented with respect to the method or process described herein and specifics in the examples may be used anywhere in one or more embodiments.

The invention claimed is:

1. An electronic component, comprising:
    an amplifier circuit; and
    a voltage-to-current converter comprising a first complementary current mirror and a second complementary current mirror coupled to the first complementary current mirror, the voltage-to-current converter configured to:
        generate a current output in response to a voltage input; and
        supply, to the amplifier circuit, the current output.

2. The electronic component of claim 1, wherein the first complementary current mirror comprises a first mirror input transistor and a first mirror output transistor, and wherein the second complementary current mirror comprises a second mirror input transistor and a second mirror output transistor.

3. The electronic component of claim 2, wherein each of the first mirror output transistor and the second mirror input transistor is an N-type transistor, and wherein each of the first mirror input transistor and the second mirror output transistor is a P-type transistor.

4. The electronic component of claim 3, the voltage-to-current converter comprising an input transistor configured to receive the voltage input and further comprising a resistive element having a first terminal and a second terminal, wherein the first complementary current mirror is coupled to the input transistor by the input transistor being coupled to the first terminal and by the second terminal being coupled to the first mirror input transistor.

5. The electronic component of claim 4, wherein the second mirror output transistor is coupled to the input transistor, and wherein the second mirror input transistor is coupled to the first mirror output transistor.

6. The electronic component of claim 5, wherein the voltage-to-current converter comprises an output transistor configured to supply the current output.

7. The electronic component of claim 6, wherein the input transistor, the N-type transistor, and the P-type transistor are bipolar junction transistors.

8. The electronic component of claim 6, wherein the input transistor, N-type transistor, and the P-type transistor are field-effect transistors.

9. The electronic component of claim 2, wherein each of the first mirror input transistor and the second mirror output transistor is an N-type transistor, and wherein each of the first mirror output transistor and the second mirror input transistor is a P-type transistor.

10. The electronic component of claim 9, the voltage-to-current converter comprising an input transistor configured to receive the voltage input and further comprising a resistive element having a first terminal and a second terminal, wherein the first complementary current mirror is coupled to the input transistor by the input transistor being coupled to the first terminal and the second terminal being coupled to the first mirror input transistor.

11. The electronic component of claim 10, wherein the second mirror output transistor is coupled to the input transistor, and wherein the second mirror input transistor is coupled to the first mirror output transistor.

12. The electronic component of claim 11, wherein the voltage-to-current converter comprises an output transistor configured to supply the current output.

13. The electronic component of claim 12, wherein the N-type transistor and the P-type transistor are bipolar junction transistors.

14. The electronic component of claim 12, wherein the N-type transistor and the P-type transistor are field-effect transistors.

15. The electronic component according to claim 1, wherein the electronic component is a transimpedance amplifier.

* * * * *